(12) United States Patent
Hoegberg et al.

(10) Patent No.: US 11,209,494 B2
(45) Date of Patent: Dec. 28, 2021

(54) FAULT MONITORING SYSTEMS FOR POWER SUPPLIES

(71) Applicant: Hamilton Sundstrand Corporation, Charlotte, NC (US)

(72) Inventors: Lon R. Hoegberg, Belvidere, IL (US); Christopher Blazer, Machesney Park, IL (US)

(73) Assignee: Hamilton Sundstrand Corporation, Charlotte, NC (US)

( * ) Notice: Subject to any disclaimer, the term of this patent is extended or adjusted under 35 U.S.C. 154(b) by 93 days.

(21) Appl. No.: 16/736,498

(22) Filed: Jan. 7, 2020

(65) Prior Publication Data

US 2021/0208206 A1 Jul. 8, 2021

(51) Int. Cl.
*G01R 31/40* (2020.01)
*B64F 5/40* (2017.01)

(52) U.S. Cl.
CPC ............... *G01R 31/40* (2013.01); *B64F 5/40* (2017.01)

(58) Field of Classification Search
CPC .................................. G01R 31/40; B64F 5/40
USPC .................... 324/764.01, 537, 500
See application file for complete search history.

(56) References Cited

U.S. PATENT DOCUMENTS

| | | |
|---|---|---|
| 5,123,017 A | 6/1992 | Simpkins et al. |
| 5,386,363 A | 1/1995 | Haak et al. |
| 7,509,537 B1 | 3/2009 | Jensen et al. |
| 8,233,974 B2 * | 7/2012 | Ward .................... A61B 5/0537 600/547 |
| 8,659,856 B2 * | 2/2014 | Kilroy .................. H02H 1/0015 361/42 |
| 2014/0252954 A1 | 9/2014 | Breuer et al. |
| 2018/0313887 A1 * | 11/2018 | Zhang ..................... H02S 50/10 |

(Continued)

FOREIGN PATENT DOCUMENTS

| | | |
|---|---|---|
| EP | 1241778 A2 | 9/2002 |
| EP | 3151409 A2 | 4/2017 |

OTHER PUBLICATIONS

Extended European Search Report for European Application No. EP21150328.9, dated May 21, 2021.

*Primary Examiner* — Giovanni Astacio-Oquendo
(74) *Attorney, Agent, or Firm* — Locke Lord LLP; Daniel J. Fiorello; Gabrielle L. Gelozin

(57) ABSTRACT

A power supply fault monitoring system can be configured to monitor for repetitive faulting of a power supply and to inhibit the power supply if repetitive faulting or a sufficiently long fault is detected. The system can include an input voltage monitor module configured to monitor input voltage to the power supply and output an input voltage status signal, an output voltage monitor module configured to monitor output voltage from the power supply and configured to output an output voltage status signal, and a fault monitor module operatively connected to the input voltage monitor module and the output voltage monitor module to receive the input voltage status signal and the output voltage status signal. The fault monitor module can be configured to detect repetitive faulting or a sufficiently long fault based on the input voltage status signal and the output voltage status signal and output a power supply inhibit signal to inhibit the power supply if repetitive faulting or a sufficiently long fault is detected.

18 Claims, 2 Drawing Sheets

(56) References Cited

U.S. PATENT DOCUMENTS

2019/0001135 A1    4/2019  Kumar et al.
2020/0350760 A1*  11/2020  Schweitzer, III ........ H02H 7/20

* cited by examiner

FAULT MONITORING SYSTEMS FOR POWER SUPPLIES

FIELD

This disclosure relates to power supply systems, e.g., fault monitoring of power supply systems.

BACKGROUND

An aircraft line replaceable unit (LRU), for example, with an intermittent fault in the internal power supply will power down and re-start every time the supply stops working and then starts working. This can result in undesired operation on the aircraft due to the repeated cycling of the unit. Existing systems cannot adequately monitor for and respond to such repetitive faulting.

Such conventional methods and systems have generally been considered satisfactory for their intended purpose. However, there is still a need in the art for improved fault monitoring systems. The present disclosure provides a solution for this need.

SUMMARY

In accordance with at least one aspect of this disclosure, a power supply fault monitoring system can be configured to monitor for repetitive faulting of a power supply or a sufficiently long power supply fault and to inhibit the power supply if repetitive faulting or a sufficiently long fault is detected. The system can include an input voltage monitor module configured to monitor input voltage to the power supply and output an input voltage status signal, an output voltage monitor module configured to monitor one or more output voltages from the power supply and configured to output an output voltage status signal, and a fault monitor module operatively connected to the input voltage monitor module and the output voltage monitor module to receive the input voltage status signal and the output voltage status signal. The fault monitor module can be configured to detect repetitive faulting or a sufficiently long fault based on the input voltage status signal and the output voltage status signal and output a power supply inhibit signal to inhibit the power supply if repetitive faulting or a sufficiently long fault is detected.

The fault monitor module can include a first logic module operatively connected to the input voltage monitor module and the output voltage monitor module to receive the input voltage status signal and the output voltage status signal therefrom, and to output an error state if the input voltage status signal and the output voltage status signal indicate that the input voltage is present but the output voltage is not present or not at an expected value. The first logic module can be an AND gate or a buffer. Any other suitable type of logic module to perform any suitable function is contemplated herein.

The fault monitor module can include a timer module operatively connected to the first logic module. The timer module can be configured to receive the error state and to determine if the error state is repeating or is sufficient long. If the error state is repeating or is sufficient long, then the timer module can output a latch activation state. The timer module can be configured to ignore transient fluctuation at a predetermined speed or less than a predetermined period.

The fault monitor module can include a latch module configured to receive the latch activation state and to output an inhibit state configured to cause inhibition of the power supply. The fault monitor module can include a comparator module operatively connected to the latch module and configured to receive the inhibit state from the latch module and to output the power supply inhibit signal to the power supply after receiving the inhibit state.

In certain embodiments, the fault monitor module can include an arming latch module operatively connected to the input voltage monitor module and/or the output voltage monitor module to receive the input voltage status signal and/or the output voltage status signal therefrom. The arming latch module can be configured to output an armed state when the output voltage status signal indicates that the output voltage is at or above a threshold.

The first logic module can be operatively connected to the arming latch module to receive the armed state. The first logic module can be configured to not output the error state unless receiving the armed state such that the power supply cannot be inhibited during power supply start up fluctuations. The arming latch module can be configured to be reset such that it does not output the armed state when the input voltage status signal indicates that the input voltage is low or off such that the arming latch module can be reset with a cycle of the input voltage.

The error state and/or the latch activation state and/or the armed state can be either an output signal or a lack of an output signal. In certain embodiments, the system can include the power supply operatively connected to the fault monitor module to receive the power supply inhibit signal therefrom when repetitive faulting or a sufficiently long fault occurs.

In accordance with at least one aspect of this disclosure, a power supply system can include a power supply and power supply fault monitoring system as disclosed herein, e.g., as described above. In accordance with at least on aspect of this disclosure, a method can include monitoring a power supply for repetitive output voltage faulting or a sufficiently long output voltage fault, and inhibiting the power supply if repetitive output voltage faulting or a sufficiently long output voltage fault is detected. Inhibiting the power supply can include shutting off the power supply such that there is no output voltage and holding until reset of an input voltage.

These and other features of the embodiments of the subject disclosure will become more readily apparent to those skilled in the art from the following detailed description taken in conjunction with the drawings.

BRIEF DESCRIPTION OF THE DRAWINGS

So that those skilled in the art to which the subject disclosure appertains will readily understand how to make and use the devices and methods of the subject disclosure without undue experimentation, embodiments thereof will be described in detail herein below with reference to certain figures, wherein.

DETAILED DESCRIPTION

Figure 1:
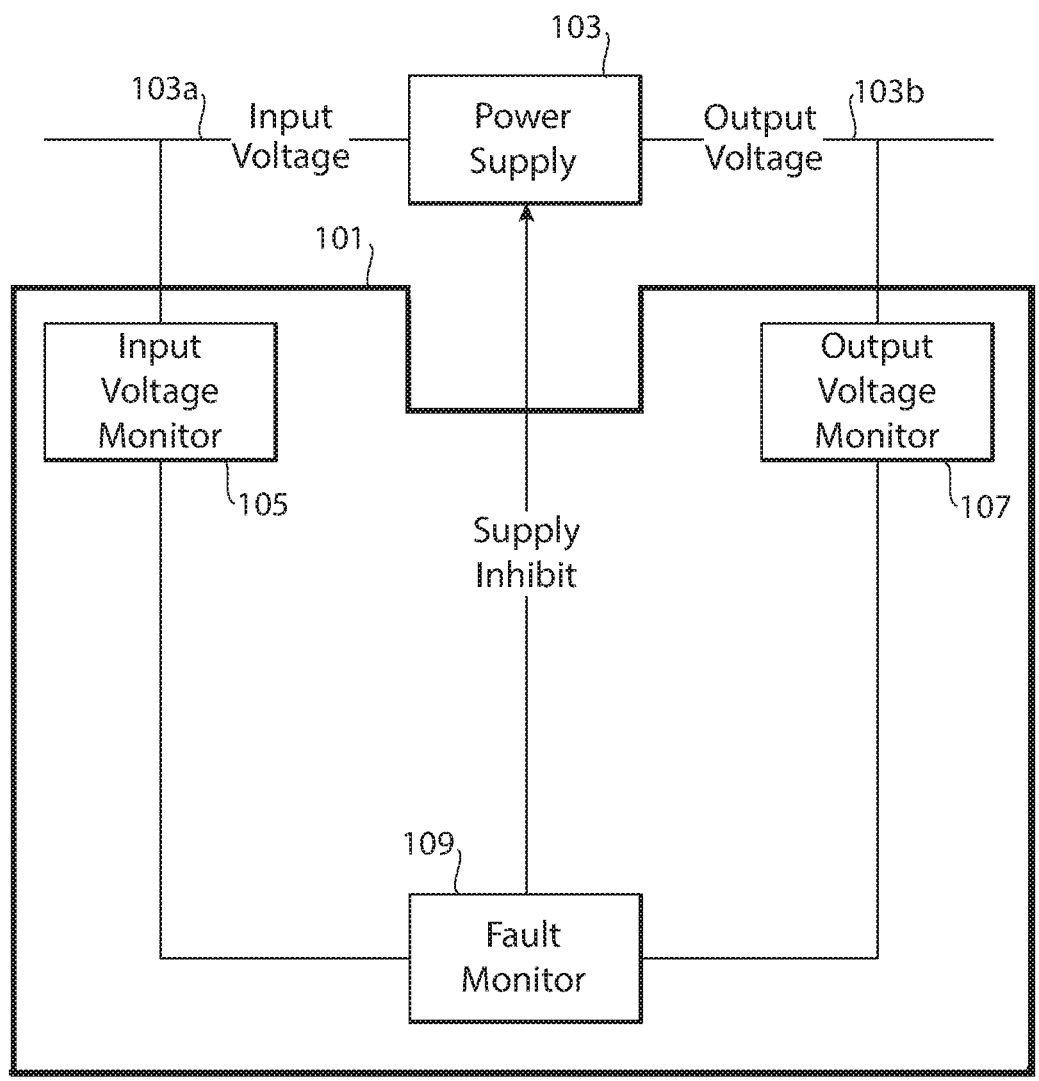
FIG. 1 is a schematic diagram of an embodiment of a power supply system in accordance with this disclosure.
Figure 2:
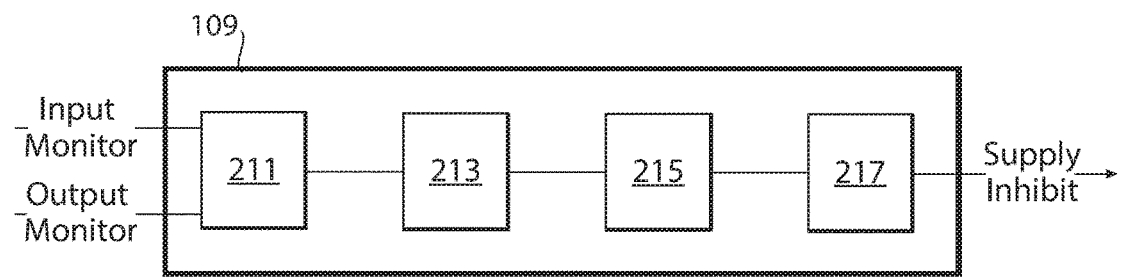
FIG. 2 is a schematic diagram of an embodiment of a fault monitor module in accordance with this disclosure.
Figure 3:
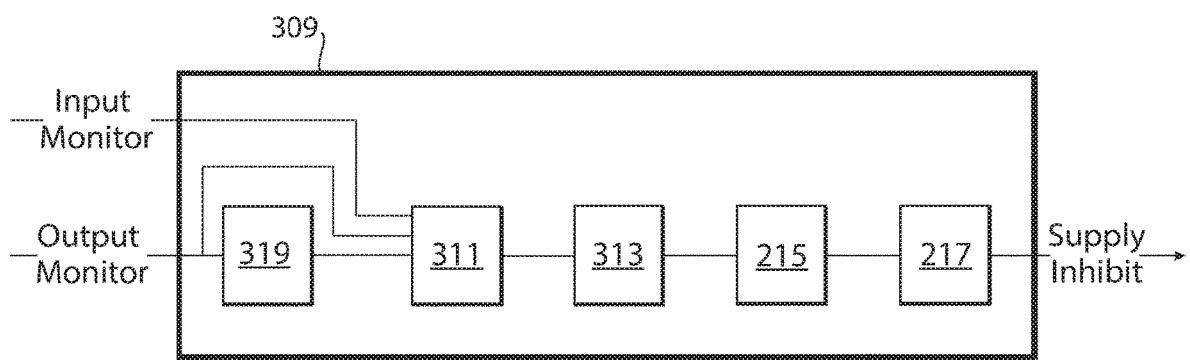
FIG. 3 is a schematic diagram of an embodiment of a fault monitor module in accordance with this disclosure.

Reference will now be made to the drawings wherein like reference numerals identify similar structural features or aspects of the subject disclosure. For purposes of explanation and illustration, and not limitation, an illustrative view of an embodiment of a power supply system in accordance with the disclosure is shown in FIG. 1 and is designated generally by reference character 100. Other embodiments and/or aspects of this disclosure are shown in FIGS. 2 and 3.

FIG. 1 shows an embodiment of a power supply system 100 having a power supply fault monitoring system 101 and a power supply 103. Referring to FIG. 1, the power supply fault monitoring system 101 can be configured to monitor for repetitive faulting of the power supply 103 or a sufficiently long power supply fault and to inhibit the power supply 103 if repetitive faulting or a sufficiently long fault is detected. Any suitable components configured to for the system 101 are contemplated herein.

Faulting can include incorrect power characteristics (e.g., to high or too low, e.g., current and/or voltage) output by the power supply. In certain embodiments, faulting can be or include no power (e.g., no voltage and/or current) being output by the power supply. Any suitable faulting type is contemplated herein. A sufficiently long fault can be any suitable selected time value by a user, for example (e.g., and can be changeable in certain embodiments). In certain embodiments, sufficiently long can be a fixed time value (e.g., a function of the system). Any suitable time (e.g., about a millisecond, about a microsecond, about a 10 milliseconds or microseconds) to be determined a sufficiently long fault it contemplated herein.

Inhibiting the power supply can include shutting off any input to the power supply. In certain embodiments, inhibiting the power supply can include reducing an input voltage and/or current to the power supply. Any other suitable type of inhibition to prevent output from the power supply or full output from the power supply is contemplated herein.

In certain embodiments, the power supply fault monitoring system 101 can include an input voltage monitor module 105 configured to monitor input voltage (e.g., on input line 103a) to the power supply 103 and output an input voltage status signal. The system 101 can include an output voltage monitor module 107 configured to monitor output voltage (e.g., on output line 103b) from the power supply 103 and configured to output an output voltage status signal.

The system 101 can include a fault monitor module 109 operatively connected to the input voltage monitor module 105 and the output voltage monitor module 107 to receive the input voltage status signal and the output voltage status signal. The fault monitor module 109 can be configured to detect repetitive faulting or a sufficiently long fault based on the input voltage status signal and the output voltage status signal. The fault monitor module 109 can output a power supply inhibit signal (e.g., to the power supply 103 as shown) to inhibit (e.g., shut off or otherwise inhibit) the power supply 103 if repetitive faulting or a sufficiently long fault is detected.

Referring additionally to FIG. 2, the fault monitor module 109 can include a first logic module 211 operatively connected to the input voltage monitor module 105 and the output voltage monitor module 107 to receive the input voltage status signal and the output voltage status signal therefrom. The first logic module 211 can be configured to output an error state (e.g., an error signal) if the input voltage status signal and the output voltage status signal indicate that the input voltage is present but the output voltage is not present or not at an expected value. The first logic module 211 can be an AND gate or a buffer, for example. Any other suitable type of logic module to perform any suitable function is contemplated herein.

The fault monitor module 109 can include a timer module 213 (e.g., a pulse qualifier) operatively connected to the first logic module 211. The timer module 213 can be configured to receive the error state and to determine if the error state is repeating or is sufficient long. If the error state is repeating or is sufficient long, then the timer module 213 can output a latch activation state (e.g., a latch activation signal), for example. The timer module 213 can function such that the error state has to exist for a certain amount of time before the fault monitor module 101 can shut off power supply 103. In certain embodiments, the length of time can be equal to or greater than delay of output voltage monitor module 107 (e.g., a voltage sensor delay) plus a start-up time (e.g., for power up time so that a fault is not automatically detected and the power supply shut off when starting up).

The timer module 213 can be configured to ignore transient fluctuation at a predetermined speed or less than a predetermined period, for example (e.g., to prevent inhibiting the power supply 103 due to normal fluctuations during operation). In this regard, the timer module 213 can be set for a maximum time to allow normal power supply oscillations.

The fault monitor module 109 can include a latch module 215 configured to receive the latch activation state and to output an inhibit state (e.g., an inhibit signal) configured to cause inhibition of the power supply 103. The latch module 215 can be any suitable type of latch (e.g., a D-type flip flop latch). For example, the latch module 215 can be configured to maintain an on state to output the inhibit state until reset (e.g., by a power cycle of the input voltage). For example, the latch module 215 can be operatively connected to the input voltage (e.g., through input line 103a or input voltage module 105) and to reset to the off state (where it is not outputting the inhibit state) when the input voltage drops below a certain value (e.g., when voltage is zero or less than a few volts).

In certain embodiments, the fault monitor module 109 can include a comparator module 217 operatively connected to the latch module 215 and configured to receive the inhibit state from the latch module 215. The comparator module 217 can be configured to output the power supply inhibit signal to the power supply 103 after receiving the inhibit state. In certain embodiments, it is contemplated that the latch module 215 can output the inhibit state directly to the power supply 103 to cause the power supply 103 be inhibited. The comparator module 217 need not be included or used, however, it can be used where desired (e.g., as an open collector comparator to drive an active low inhibit signal).

In certain embodiments, referring additionally to the embodiment of a fault monitor module 309 of FIG. 3, the fault monitor module 309 can include an arming latch module 319 operatively connected to the input voltage monitor module 105 and/or the output voltage monitor module 107 to receive the input voltage status signal and/or the output voltage status signal therefrom. The arming latch module 319 can be configured to output an armed state (e.g., an armed signal) when the output voltage status signal indicates that the output voltage is at or above a threshold (e.g., a normal operating voltage after start up). For example, the arming latch module output can be activated once the output status indicates proper output. Once activated, the arming latch module 319 can be configured to remain active until the input status indicates the input is not valid (e.g., such that there is no input voltage).

The first logic module 311 can be similar to first logic module 211 as disclosed above with respect to the embodiment of FIG. 2, and can also be operatively connected to the arming latch module 319 to receive the armed state. The first logic module 311 can be configured to not output the error state unless receiving the armed state such that the power supply 103 cannot be inhibited during power supply start up fluctuations, for example. In this regard, the first logic module 311 can be configured to output the error state (e.g., an error signal) if the input voltage status signal and the output voltage status signal indicate that the input voltage is present but the output voltage is not present or not at an expected value and the first logic module 311 is receiving the armed signal. The arming latch module 319 can be configured to be reset (such that it does not output the armed state) when the input voltage status signal indicates that the input voltage is low or off. In this regard, the arming latch module 319 can be reset with a cycle of the input voltage, thereby resetting the logic of the fault monitoring module 309.

Certain systems can have a power up time delay. For example, an output monitor delay (e.g., of 11 milliseconds in certain embodiments). Certain embodiments can eliminate this issue by having logic that is only looking for on/off repetition, e.g., not monitoring voltage values.

It is contemplated that the embodiment of FIG. 3 may be able to operate faster than the embodiment of FIG. 2 since the timer module 313 can be configured to only ignore very fast glitches instead of having to account for start-up time delay time plus voltage sensor delay time. In certain embodiments, this can reduce reaction time of the fault monitor module 109. For example, the embodiment of FIG. 3 can react in the low microseconds as opposed to milliseconds of the embodiment of FIG. 2. Regardless, both embodiments are an improvement over traditional systems and can be useful. Both embodiments can include a manual reset (e.g., pilot controlled) if desired.

The error state and/or the latch activation state and/or the armed state can be either an output signal or a lack of an output signal. Any suitable signal types (e.g., true/false) and/or logic is contemplated herein. In certain embodiments, the system 100 can include the power supply 103 operatively connected to the fault monitor module 109, 309 to receive the power supply inhibit signal therefrom when repetitive faulting or a sufficiently long fault occurs (which can prevent repetitive faulting before it occurs).

In accordance with at least one aspect of this disclosure, a power supply system 100 can include a power supply 103 and power supply fault monitoring system 101 as disclosed herein, e.g., as described above. In accordance with at least on aspect of this disclosure, a method can include monitoring a power supply for repetitive output voltage faulting or a sufficiently long output voltage fault, and inhibiting the power supply if repetitive output voltage faulting or a sufficiently long output voltage fault is detected. Inhibiting the power supply can include shutting off the power supply such that there is no output voltage and holding until reset of an input voltage.

Certain embodiments can detect a fault when an input voltage is present, but output voltage is not present. If the fault is repetitive, for example, (e.g., occurring at least twice within a predefined period of time) then certain embodiments can shut down the power supply, e.g., until some condition (e.g., input voltage is turned off, e.g., aircraft electronic system off).

Embodiments can provide a solution that monitors the power supply input and output to detect the intermittent toggling of the power supply. If the input to the supply has power long enough that the output should be on and the output is not on, then a latch can be set to indicate the failure. This indication can be used to inhibit the supply operation to prevent cycling. The latch can be cleared upon removal of the input power, thus allowing return to normal operation. In certain embodiments, if the delay time at power-up is too long in relation to the expected intermittency, the circuit can only be triggered by a loss of the output only after it has already been on.

Certain embodiments can be used for power supply to line replaceable units (LRUs), e.g., for aircraft. Using embodiments, LRU operation during an intermittent supply failure becomes deterministic and/or predictable. The power supply is inhibited if repetitive faulting or a sufficiently long fault is detected to prevent toggling of the LRU.

Any, all, or any combination of module(s) disclosed herein, e.g., as descried above, can include any suitable hardware module(s) and/or software module(s). It is contemplated herein that any, all, or any combination of modules disclosed herein can be one or more analog logic module(s) and/or digital logic module(s).

As will be appreciated by those skilled in the art, aspects of the present disclosure may be embodied as a system, method, or computer program product. Accordingly, aspects of this disclosure may take the form of an entirely hardware embodiment, an entirely software embodiment (including firmware, resident software, micro-code, etc.), or an embodiment combining software and hardware aspects, all possibilities of which can be referred to herein as a "circuit," "module," or "system." A "circuit," "module," or "system" can include one or more portions of one or more separate physical hardware and/or software components that can together perform the disclosed function of the "circuit," "module," or "system", or a "circuit," "module," or "system" or any combinations thereof can be a single self-contained unit (e.g., of hardware and/or software). Furthermore, aspects of this disclosure may take the form of a computer program product embodied in one or more computer readable medium(s) having computer readable program code embodied thereon.

Any combination of one or more computer readable medium(s) may be utilized. The computer readable medium may be a computer readable signal medium or a computer readable storage medium. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium may be any tangible medium that can contain, or store a program for use by or in connection with an instruction execution system, apparatus, or device.

A computer readable signal medium may include a propagated data signal with computer readable program code embodied therein, for example, in baseband or as part of a carrier wave. Such a propagated signal may take any of a variety of forms, including, but not limited to, electromagnetic, optical, or any suitable combination thereof. A computer readable signal medium may be any computer readable medium that is not a computer readable storage medium and that can communicate, propagate, or transport a program for use by or in connection with an instruction execution system, apparatus, or device.

Program code embodied on a computer readable medium may be transmitted using any appropriate medium, including but not limited to wireless, wireline, optical fiber cable, RF, etc., or any suitable combination of the foregoing.

Computer program code for carrying out operations for aspects of this disclosure may be written in any combination of one or more programming languages, including an object oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the this disclosure may be described above with reference to flowchart illustrations and/or block diagrams of methods, apparatus (systems) and computer program products according to embodiments of this disclosure. It will be understood that each block of any flowchart illustrations and/or block diagrams, and combinations of blocks in any flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in any flowchart and/or block diagram block or blocks.

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified herein.

Those having ordinary skill in the art understand that any numerical values disclosed herein can be exact values or can be values within a range. Further, any terms of approximation (e.g., "about", "approximately", "around") used in this disclosure can mean the stated value within a range. For example, in certain embodiments, the range can be within (plus or minus) 20%, or within 10%, or within 5%, or within 2%, or within any other suitable percentage or number as appreciated by those having ordinary skill in the art (e.g., for known tolerance limits or error ranges).

The articles "a", "an", and "the" as used herein and in the appended claims are used herein to refer to one or to more than one (i.e., to at least one) of the grammatical object of the article unless the context clearly indicates otherwise. By way of example, "an element" means one element or more than one element.

The phrase "and/or," as used herein in the specification and in the claims, should be understood to mean "either or both" of the elements so conjoined, i.e., elements that are conjunctively present in some cases and disjunctively present in other cases. Multiple elements listed with "and/or" should be construed in the same fashion, i.e., "one or more" of the elements so conjoined. Other elements may optionally be present other than the elements specifically identified by the "and/or" clause, whether related or unrelated to those elements specifically identified. Thus, as a non-limiting example, a reference to "A and/or B", when used in conjunction with open-ended language such as "comprising" can refer, in one embodiment, to A only (optionally including elements other than B); in another embodiment, to B only (optionally including elements other than A); in yet another embodiment, to both A and B (optionally including other elements); etc.

As used herein in the specification and in the claims, "or" should be understood to have the same meaning as "and/or" as defined above. For example, when separating items in a list, "or" or "and/or" shall be interpreted as being inclusive, i.e., the inclusion of at least one, but also including more than one, of a number or list of elements, and, optionally, additional unlisted items. Only terms clearly indicated to the contrary, such as "only one of" or "exactly one of," or, when used in the claims, "consisting of," will refer to the inclusion of exactly one element of a number or list of elements. In general, the term "or" as used herein shall only be interpreted as indicating exclusive alternatives (i.e., "one or the other but not both") when preceded by terms of exclusivity, such as "either," "one of," "only one of," or "exactly one of."

Any suitable combination(s) of any disclosed embodiments and/or any suitable portion(s) thereof are contemplated herein as appreciated by those having ordinary skill in the art in view of this disclosure.

The embodiments of the present disclosure, as described above and shown in the drawings, provide for improvement in the art to which they pertain. While the subject disclosure includes reference to certain embodiments, those skilled in the art will readily appreciate that changes and/or modifications may be made thereto without departing from the spirit and scope of the subject disclosure.

What is claimed is:

1. A power supply fault monitoring system configured to monitor for repetitive faulting of a power supply or a sufficiently long power supply fault and to inhibit the power supply if repetitive faulting or a sufficiently long fault is detected
   an input voltage monitor module configured to monitor input voltage to the power supply and output an input voltage status signal;
   an output voltage monitor module configured to monitor output voltage from the power supply and configured to output an output voltage status signal; and
   a fault monitor module operatively connected to the input voltage monitor module and the output voltage monitor module to receive the input voltage status signal and the output voltage status signal, wherein the fault monitor module is configured to:
   detect repetitive faulting or a sufficiently long fault based on the input voltage status signal and the output voltage status signal; and output a power supply inhibit signal to inhibit the power supply if repetitive faulting or a sufficiently long fault is detected.

2. The system of claim 1, wherein the fault monitor module includes a first logic module operatively connected to the input voltage monitor module and the output voltage monitor module to receive the input voltage status signal and the output voltage status signal therefrom, and to output an error state if the input voltage status signal and the output voltage status signal indicate that the input voltage is present but the output voltage is not present or not at an expected value.

3. The system of claim 2, wherein the first logic module is an AND gate or a buffer.

4. The system of claim 2, wherein the fault monitor module includes a timer module operatively connected to the first logic module, the timer module configured to receive the error state and to determine if the error state is repeating or is sufficient long, wherein if the error state is repeating or is sufficient long, then the timer module outputs a latch activation state.

5. The system of claim 4, wherein the timer module is configured to ignore transient fluctuation at a predetermined speed or less than a predetermined period.

6. The system of claim 4, wherein the fault monitor module includes a latch module configured to receive the latch activation state and to output an inhibit state configured to cause inhibition of the power supply.

7. The system of claim 6, wherein the fault monitor module includes a comparator module operatively connected to the latch module and configured to receive the inhibit state from the latch module and to output the power supply inhibit signal to the power supply after receiving the inhibit state.

8. The system of claim 6, further comprising an arming latch module operatively connected to the input voltage monitor module and/or the output voltage monitor module to receive the input voltage status signal and/or the output voltage status signal therefrom, wherein the arming latch module is configured to output an armed state when the output voltage status signal indicates that the output voltage is at or above a threshold.

9. The system of claim 8, wherein the first logic module is operatively connected to the arming latch module to receive the armed state, wherein the first logic module is configured to not output the error state unless receiving the armed state such that the power supply cannot be inhibited during power supply start up fluctuations.

10. The system of claim 9, wherein the arming latch module is configured to be reset such that it does not output the armed state when the input voltage status signal indicates that the input voltage is low or off such that the arming latch module is reset with a cycle of the input voltage.

11. The system of claim 3, wherein the error state and/or the latch activation state and/or the armed state is either an output signal or a lack of an output signal.

12. The system of claim 1, further comprising the power supply operatively connected to the fault monitor module to receive the power supply inhibit signal therefrom when repetitive faulting or a sufficiently long fault occurs.

13. A power supply system, comprising:
a power supply; and
a power supply fault monitoring system configured to monitor for repetitive faulting of a power supply or a sufficiently long power supply fault and to inhibit the power supply if repetitive faulting or a sufficiently long fault is detected,
wherein the power supply fault monitoring system further includes:
an input voltage monitor module configured to monitor input voltage to the power supply and output an input voltage status signal;
an output voltage monitor module configured to monitor output voltage from the power supply and configured to output an output voltage status signal; and
a fault monitor module operatively connected to the input voltage monitor module and the output voltage monitor module to receive the input voltage status signal and the output voltage status signal, wherein the fault monitor module is configured to:
detect repetitive faulting or a sufficiently long fault based on the input voltage status signal and the output voltage status signal; and
output a power supply inhibit signal to inhibit the power supply if repetitive faulting or a sufficiently long fault is detected.

14. The system of claim 13, wherein the fault monitor module includes a first logic module operatively connected to the input voltage monitor module and the output voltage monitor module to receive the input voltage status signal and the output voltage status signal therefrom, and to output an error state if the input voltage status signal and the output voltage status signal indicate that the input voltage is present but the output voltage is not present or not at an expected value.

15. The system of claim 14, wherein the first logic module is an AND gate or a buffer.

16. The system of claim 14, wherein the fault monitor module includes a timer module operatively connected to the first logic module, the timer module configured to receive the error state and to determine if the error state is repeating or is sufficient long, wherein if the error state is repeating or is sufficient long, then the timer module outputs a latch activation state.

17. A method, comprising:
monitoring an input voltage and an output voltage of a power supply for repetitive faulting or a sufficiently long fault; and
inhibiting the power supply if repetitive faulting or a sufficiently long fault is detected.

18. The method of claim 17, wherein inhibiting the power supply includes shutting off the power supply such that there is no output voltage and holding until reset of an input voltage.

* * * * *